United States Patent
Henwood (12)

(10) Patent No.: US 6,229,361 B1
(45) Date of Patent: *May 8, 2001

(54) SPEED-UP CHARGE PUMP CIRCUIT TO IMPROVE LOCK TIME FOR INTEGER-N OR FRACTIONAL-N GSM WIRELESS DATA/VOICE APPLICATIONS

(75) Inventor: Andrew M. Henwood, Dallas, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,403

(22) Filed: Feb. 10, 1999

(51) Int. Cl.$^7$ ....................................... H03L 7/00
(52) U.S. Cl. ........................... 327/145; 327/113; 327/157
(58) Field of Search .................... 327/145, 157, 327/158, 159, 113, 114, 121, 115, 116

(56) References Cited

U.S. PATENT DOCUMENTS

| | | | |
|---|---|---|---|
| 5,646,562 | * 7/1997 | Abe | 327/159 |
| 5,864,249 | * 1/1999 | Shoji | 327/159 |
| 5,942,949 | * 8/1999 | Wilson et al. | 327/159 |

* cited by examiner

Primary Examiner—Jung Ho Kim
(74) Attorney, Agent, or Firm—Ronald O. Neerings; Wade James Brady, III; Frederick J. Telecky, Jr.

(57) ABSTRACT

A system and method for speed-up of the frequency switching time of a circuit, generally a voltage controlled oscillator having an operating frequency controlling input terminal. A first control circuit is coupled to the frequency controlling input terminal for maintaining the operating frequency of the oscillator at its first selected operating frequency. Circuitry is provided which is responsive to a directed change from the first operating frequency of the oscillator to a second different operating frequency of the oscillator to apply a voltage to the input terminal determined by the size of the directed change in the operating frequency and for a predetermined time period. This circuitry includes a switch coupled to the input terminal, a charge pump coupled to the switch and remote from the input terminal and a timer controlling the current output of the charge pump and the switch. The output of the charge pump is a current which is converted to a voltage. The system further includes a digital signal processor responsive to the amount of change of operating frequency for controlling the amount of current in a range manner provided by the charge pump and for controlling the time period of application of the current to the circuitry for converting the current to a voltage. The circuitry for converting said current to a voltage is an RC circuit which includes a resistor in parallel with a capacitor.

18 Claims, 1 Drawing Sheet

SPEED-UP CHARGE PUMP CIRCUIT TO IMPROVE LOCK TIME FOR INTEGER-N OR FRACTIONAL-N GSM WIRELESS DATA/VOICE APPLICATIONS

FIELD OF THE INVENTION

This invention relates to a system and method for speeding up frequency switching time and particularly frequency switching time of a voltage controlled oscillator in a wireless communication system.

BACKGROUND AND BRIEF DESCRIPTION OF THE PRIOR ART

Charge pumps are generally a part of a phase lock loop system and are used in transmitter/receivers of wireless communication systems in conjunction with a voltage controlled oscillator to speed up the change from an existing frequency of operation to a different frequency of operation.

A typical phase lock loop system of the type used in wireless communication is shown in FIG. 1 and includes a reference frequency oscillator 1 which is a very accurate frequency source. The frequency emitted by the oscillator 1 is divided down by a predetermined factor N in a divider circuit 3 and fed to one input of a comparator 5. A voltage controlled oscillator (VCO) 7 having a known tuning or frequency output range, the output frequency of which is controlled by a control voltage applied thereto, provides an output frequency which is divided down by a predetermined factor M in a divider 9 and fed to the other input of comparator 5. The comparator 5 provides an output error signal indicative of the difference and direction of the difference in frequency output between the reference oscillator 1 and the VCO 7. The output frequency of the VCO 7 is the frequency at which the associated transmitter/receiver operates as is well known. The error signal is applied to a charge pump 11 which provides a charge onto a low pass or loop filter 13 composed of a capacitor 27 to ground with a series connected resistor 29 and capacitor 25 in parallel therewith. The filter 13 is coupled to the VCO 7 to control the output frequency of the VCO and drive the output of the VCO to the desired and correct frequency.

In operation, it is often necessary to change the frequency of operation of the VCO 7. The amount of frequency adjustment within the frequency output range of the VCO can vary from very small up to the entire limit of the output range. The greater the amount of frequency adjustment required, the greater is the amount of current (translated as voltage) required to make the frequency adjustment. The speed of this change of frequency is generally controlled by the use of a charge pump which is generally composed of a pair of current sources 15, 17. The error signal will be small from the comparator 5 to the charge pump 11 when the frequency of operation remains unchanged or the charge pump will supply small changes in current for small frequency adjustments via the current sources 15, 17. However, for a rapid change in operating frequency, a large amount of current must be sinked or sourced into the loop which results from the large error signal supplied by the comparator 5. In the prior art, this has been accomplished by applying an even larger current from a separate current source 19 in addition to the current from the current sources 15 and 17 with a switch (not shown) being enabled to create a path for a predetermined limited time under control of a timer 23 to the capacitor 25 of the filter 13 in the loop to provide additional large current for a short time period to provide the rapid change in operating frequency of the VCO 7. This speed up circuit effectively opens the bandwidth of the low pass or loop filter 13 to improve speed-up time when the synthesizer switches from one frequency to another. The limitation is that when the switch (not shown) is enabled in the integral leg of the loop filter, the charge pump blindly delivers a charge to the capacitor with little control over the amount of current being delivered. This can and usually does result in significant undershoot or overshoot of the new target VCO frequency. Also, the charge pump delivers current only when there is a phase difference in the phase frequency detector. Although the lock times are better than without speed-up mode, the switching requirements in the Global System of Mobile Communications (GSM), the most used digital wireless standard in the world, and other wireless systems are such as to preclude prior art approaches to speed-up mode circuits for conventional integer N synthesizers or fractional N synthesizers.

SUMMARY OF THE INVENTION

In accordance with the present invention, the above described problems inherent in the prior art are minimized if not overcome by providing an improved charge pump whereby the amount of current delivered by the charge pump can be more readily controlled.

Briefly, the charge pump in accordance with the present invention takes advantage of the fact that, during the speed-up mode, there are normally several different current ratios (speed-up current(current required during a frequency transition of the VCO)/normal mode current (normal operating current)) that can be chosen, this depending upon the degree of frequency change of the VCO within its operating frequency range. During speed-up mode, rather than closing a switch where a single charge pump circuit is enabled, the charge pump circuit is mirrored to a secondary charge pump circuit which has a voltage setting resistor that provides a voltage (determined by the selected speed-up current level) on the proportional leg of the loop filter. During speed-up, the mirrored charge is enabled to source current continuously by a programmable timing counter. Since this current being delivered to the capacitor of the filter (effectively a voltage) is continuous and not dependent upon the phase difference coming out of the phase frequency detector, a voltage level at the capacitor can be set very quickly. Thus, this system provides a procedure for moving the tune voltage very close to the final voltage value very rapidly for the programmed timed period with the regular charge pump circuits then bringing the tune voltage to the final correct level.

The above is accomplished by providing an auxiliary charge pump circuit with a voltage setting resistor, a timing counter and a high speed, low capacitance switch to connect the auxiliary charge pump to the proportional capacitor for a predetermined time period to provide the initial rough change in frequency of the VCO.

The benefits of the above described improvement provide a charge pump circuit that charges the integral capacitor to a voltage very close to the final voltage in a very short time period. After this initial charging, the regular charge pump and phase detectors then bring the loop to the final required voltage. This is especially valuable when the VCO must be tuned from the low part of the its frequency band range to the upper part of that range or vice-versa. This lowers the overall lock time for a traditional integer-N or fractional-N synthesizer. Thus, the faster lock times are obtained.

DESCRIPTION OF THE PREFERRED EMBODIMENT

Figure 1:
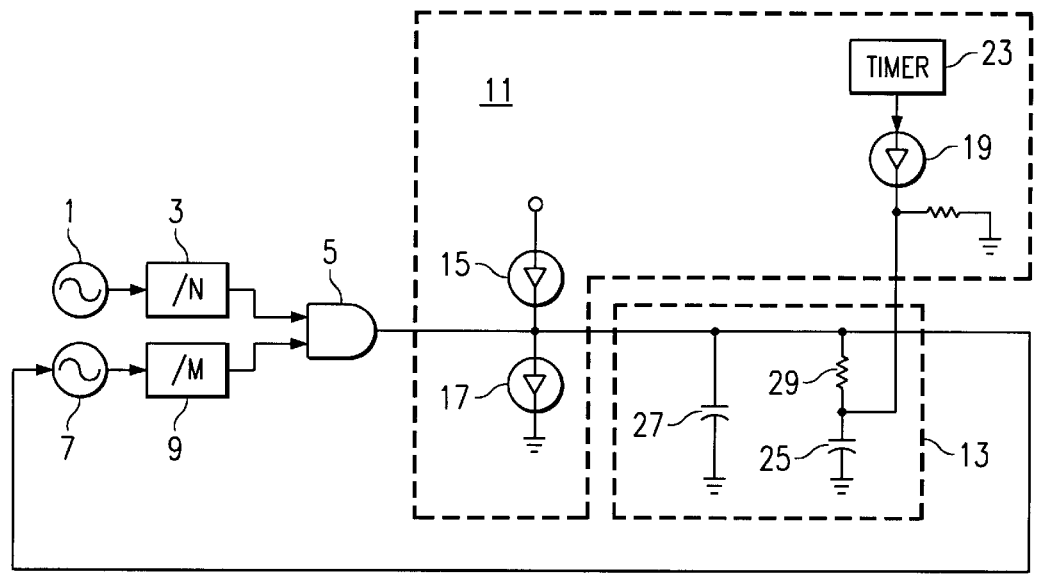
FIG. 1 is a schematic block diagram of a phase lock loop with a charge pump in accordance with the prior art.
Figure 2:
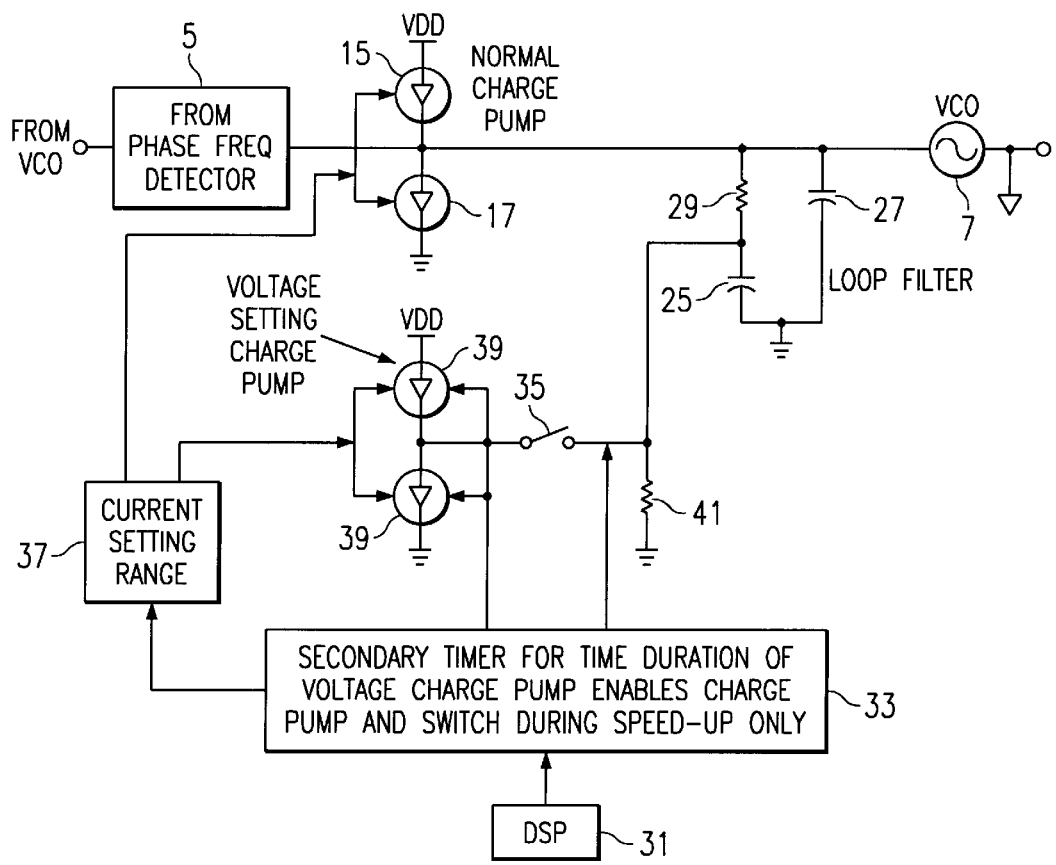
FIG. 2 is a schematic diagram of a phase lock loop with a charge pump in accordance with the present invention.

Referring to FIG. 2 wherein like numbers represent the same or similar structures as in FIG. 1, there is shown a schematic diagram of a phase lock loop using the charge pump arrangement in accordance with the present invention. It is understood that the voltage required to provide an output of a predetermined frequency from a VCO can be roughly predetermined. Accordingly, when the VCO is to switch the operating frequency thereof from a first frequency to a second frequency, the increase or decrease of voltage to the VCO can be roughly determined.

In accordance with the present invention, the total operating frequency range of the VCO is divided into a maximum of n ranges, for example, eight (8). Assuming that the total operating frequency range of integral VCO operating frequencies or channels of interest number one hundred twenty eight (128), then each range will represent a change of the total operating frequency range of the VCO divided by sixteen (16) to provide the eight ranges with only whole integer or channel values being considered. Therefore, for example, a change in frequency from the lowest possible operating frequency to the highest possible operating frequency of the VCO 7 will result in a change through eight (8) ranges whereas a frequency change of, for example, twenty (20) will result in a movement through two (2) ranges. A digital signal processor (DSP) 31 calculates this whole integer to determine the sub-range in which the frequency change is to take place. Under control of the DSP 31, a secondary timer 33 is enabled to cause closure of a switch 35 only during the switching period. Concurrently, the DSP 31 enables and programs a current setting range circuit 37 which is well known in the prior art and forms no part of the present invention. The current setting range circuit 37 sets the current output of and enables a charge pump 39 to apply current in accordance with the chosen range through the switch 35 to the junction of capacitor 25 and resistor 29 and a voltage setting resistor 41 to ground which determines the voltage on capacitor 25 to be applied to the VCO 7, this current being applied as a voltage to the VCO 7 and rapidly changing the operating frequency of the VCO to an operating frequency in the near vicinity of the newly selected operating frequency. The switch 35 is then opened by the secondary timer 33 with the final operating frequency of VCO 7 being reached in accordance with prior art techniques as explained hereinabove.

In operation, the DSP 31 will receive signals from the base station in the network indicating, or from which an indication can be made of, the frequency switching range to be made by the VCO 7. The DSP 31 is aware of the prior frequency at which the VCO 7 was operating. The DSP 31 then proceeds to provide current setting range circuit 37 with a signal indicating the range in which the change is to be made and also activates the secondary timer circuit 33. The current setting range circuit 37 then controls the charge pump 39 to deliver current in the selected current range and secondary timer 33 concurrently closes the switch 35. This causes the capacitor 25 to be charged with the voltage across the capacitor 25 determined by the resistor 41. This voltage is applied to the VCO 7 and rapidly changes the operating frequency of the VCO to a frequency in the selected range which will be close to the final range at which the VCO is to operate. The switch 35 is then opened under control of the secondary timer 33 and the speed-up charge pump 39 is disabled under control of the secondary timer 33. Operation then continues in accordance with prior art techniques as discussed above with reference to FIG. 1 to bring the VCO 7 operating frequency to the selected frequency.

It can be seen that the VCO operating frequency is very rapidly switched to a new operating frequency very close to the newly selected operating frequency in accordance with the present invention with the prior art operation taking over only when the newly selected operating frequency is almost achieved. In the prior art, the speed up charge pump is enabled only when error signals are provided by the phase comparator 5, this being only when pulses are received rather than continuously as in accordance with the present invention, with frequency change being based only upon such error signals. Accordingly, the likelihood of overshoot is substantially eliminated and the newly selected operating frequency is achieved much more rapidly than in accordance with the prior art.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A system for speed-up of the frequency switching time of a circuit which comprises:
   (a) a voltage controlled oscillator having an operating frequency controlling input terminal;
   (b) a first control circuit coupled to said frequency controlling input terminal for maintaining the operating frequency of said voltage controlled oscillator at a first selected operating frequency; and
   (c) circuitry including a second control circuit selectively coupled to said frequency controlling input terminal and responsive to a directed change of operation of said voltage controlled oscillator from said first selected operating frequency to a second operating frequency different from said first operating frequency to apply one of a plurality of different selected voltages to said second control circuit, said one of a plurality of different selected voltages being determined by the size of the directed change in said operating frequency, said second control circuit being operable for a predetermined time period, to roughly alter the operating frequency of said voltage controlled oscillator to the vicinity of said second operating frequency;
   (d) said circuitry then controlling said first control circuit to continue control of said frequency controlling input directly responsive only to said first control circuit at said second operating frequency while the second control circuit is disconnected from the input terminal.

2. The system of claim 1 wherein said circuitry includes a switch coupled to said input terminal, a charge pump coupled to said switch and remote from said input terminal and a timer controlling the current output of said charge pump and said switch.

3. The system of claim 2 wherein said circuitry further includes means to convert the output of said charge pump to a voltage.

4. The system of claim 1 wherein said circuitry includes a charge pump, a digital signal processor responsive to the amount of change of operating frequency for controlling the amount of current provided by said charge pump, circuitry coupled to said input terminal and said charge pump for converting said current to a voltage and a switch responsive to said digital signal processor for controlling the time period of application of said current to said circuitry for converting said current to a voltage.

5. The system of claim 4 further including a current setting range circuit controlled by said digital signal processor and coupled to said charge pump for setting the current output of said charge pump to one of a plurality of current output ranges.

6. A system for speed-up of the frequency switching time of a circuit which comprises:
   (a) a voltage controlled oscillator having an operating frequency controlling input terminal;
   (b) a first control circuit coupled to said frequency controlling input terminal for maintaining the operating frequency of said oscillator at its first selected operating frequency; and
   (c) circuitry responsive to a directed change from said first operating frequency of said oscillator to a second different operating frequency of said oscillator to apply a voltage to said input terminal determined by the size of the directed change in said operating frequency and for a predetermined time period which includes a charge pump, a digital signal processor responsive to the amount of change of operating frequency for controlling the amount of current provided by said charge pump circuitry coupled to said input terminal and said charge pump for converting said current to a voltage and a switch responsive to said digital signal processor for controlling the time period of application of said current to said circuitry for converting said current to a voltage;
   wherein said circuitry for converting said current to a voltage comprises an RC circuit.

7. The system of claim 6 further including a current setting range circuit controlled by said digital signal processor and coupled to said charge pump for setting the current output of said charge pump to one of a plurality of current output ranges.

8. The system of claim 6 wherein said RC circuit includes a resistor in parallel with a capacitor.

9. The system of claim 7 wherein said RC circuit includes a resistor in parallel with a capacitor.

10. A method for speed-up of the frequency switching time of a circuit which comprises the steps of:
    (a) providing a voltage controlled oscillator having an operating frequency controlling input terminal;
    (b) providing a first control circuit coupled to said frequency controlling input terminal for maintaining the operating frequency of said voltage controlled oscillator at a first selected operating frequency;
    (c) providing circuitry including a second control circuit coupled to said frequency controlling input terminal and responsive to a directed change of operation of said voltage controlled oscillator from said first selected operating frequency to a second operating frequency different from said first operating frequency to apply one of a plurality of different selected voltages to said second control circuit, said one of a plurality of different selected voltages being determined by the size of the directed change in said operating frequency, said second control circuit being operable for a predetermined time period to alter the operating frequency of said voltage controlled oscillator to a frequency closer to said second operating frequency; and
    (d) under direct control of only said first control circuit, adjusting said operating frequency of said voltage controlled oscillator to said second operating frequency while the second control circuit is disconnected from the input terminal.

11. The method of claim 10 wherein the step of applying a voltage includes providing a switch coupled to said input terminal, a charge pump coupled to said switch and remote from said input terminal and a timer controlling the current output of said charge pump and said switch and closing said switch for a predetermined time, converting said charge to a voltage and applying said voltage during said predetermined time to said input terminal.

12. The method of claim 11 further including, responsive to the amount of change of operating frequency, controlling the amount of current provided by said charge pump.

13. The method of claim 11 further including setting the current output of said charge pump to one of a plurality of current output ranges.

14. The method of claim 12 further including setting the current output of said charge pump to one of a plurality of current output ranges.

15. A system for speed-up of the frequency switching time of a circuit which comprises:
    (a) a voltage controlled oscillator having an operating frequency controlling input terminal;
    (b) a first control circuit coupled to said frequency controlling input terminal for controlling the operating frequency of said voltage controlled oscillator;
    (c) a second control circuit providing more rapid control of said voltage controlled oscillator than said first control circuit, said second control circuit selectively coupled to said frequency controlling input for controlling change of the operating frequency of said voltage controlled oscillator, said second control circuit including:
       (i) a processor responsive to a received indication of a change in said operating frequency for providing control signals;
       (ii) a timer responsive to said processor for selectively coupling said second control circuit to said first control circuit; and
       (iii) a setting range circuit responsive to said processor for altering said operating frequency input to a range indicative of said change of frequency
    (d) a current setting range circuit coupled to each of said first and second control circuits for determining the operating frequency to be set by said first and second control circuits; and
    (e) a controller for controlling said current setting range circuit and said selective operation of said second control circuit.

16. The system of claim 15 wherein said processor is a digital signal processor.

17. A method for speed-up of the frequency switching time of a circuit which comprises the steps of:
    (a) providing a voltage controlled oscillator having an operating frequency controlling input terminal;
    (b) providing a first control circuit coupled to said frequency controlling input terminal for controlling the operating frequency of said voltage controlled oscillator at a first selected operating frequency.
    (c) providing a frequency altering circuit including a second control circuit for altering the input at said input terminal to one of a plurality of settings, said frequency altering circuit including the steps of:
       (i) determining the amount of frequency alteration;
       (ii) selecting one of a range of voltages determined by said determination of the amount of frequency alteration;

(iii) applying the selected voltage to said second control circuit for a predetermined time period to roughly alter said frequency of operation of said voltage controlled oscillator in the range of the altered frequency; and
(iv) removing said second control circuit from frequency alteration of said voltage controlled oscillator after said predetermined time and allowing said voltage controlled oscillator to reach said altered frequency only under direct control of said first control circuit while the second control circuit is disconnected from the input terminal.

18. The method of claim 17 wherein said frequency altering circuit includes a DSP.

* * * * *